United States Patent [19]

Schoolar et al.

[11] 4,126,732
[45] Nov. 21, 1978

[54] SURFACE PASSIVATION OF IV-VI SEMICONDUCTORS WITH $As_2S_3$

[75] Inventors: Richard B. Schoolar, Silver Spring; James D. Jensen, Highland, both of Md.

[73] Assignee: The United States of America as represented by the Secretary of the Navy, Washington, D.C.

[21] Appl. No.: 825,007

[22] Filed: Aug. 16, 1977

[51] Int. Cl.² .................... H01L 21/208; B05D 5/12; H01L 21/368
[52] U.S. Cl. .................... 428/539; 148/1.5; 148/31.5; 148/174; 148/189; 252/62.3 GA; 423/561 R; 427/87; 427/248 R; 427/294; 357/52; 357/61
[58] Field of Search ............ 357/52, 61; 148/1.5, 148/189, 31.5, 174; 427/86, 87, 82, 314, 419 R, 248 R, 294; 428/539; 252/62.3 GA; 423/561 R, 87

[56] References Cited

U.S. PATENT DOCUMENTS

| | | | |
|---|---|---|---|
| 2,882,471 | 4/1959 | Wernick | 357/61 |
| 2,979,382 | 4/1961 | Frerichs | 423/561 R |
| 3,124,478 | 3/1964 | Cirkler et al. | 427/82 X |
| 3,303,399 | 2/1967 | Hoogendoorn et al. | 427/82 X |
| 3,451,845 | 6/1969 | Schuler | 427/87 X |
| 3,506,502 | 4/1970 | Nakamura | 148/1.5 X |
| 3,705,059 | 12/1972 | Kun | 357/61 X |
| 3,716,424 | 2/1973 | Schoolar | 148/1.5 X |
| 3,925,146 | 12/1975 | Olsen et al. | 427/86 X |
| 3,993,506 | 11/1976 | Moon | 357/52 X |
| 4,049,478 | 9/1977 | Ghosh et al. | 148/189 X |
| 4,069,356 | 1/1978 | Fischer | 427/248 R |
| 4,077,817 | 3/1978 | Bellavance | 252/62.3 GA |
| 4,080,723 | 3/1978 | Holloway | 357/61 X |

Primary Examiner—Harold Ansher
Attorney, Agent, or Firm—R. S. Sciascia; A. L. Branning; R. E. Bushnell

[57] ABSTRACT

The process of coating epitaxial films of lead chalcogenide materials with $As_2S_3$ to insulate the films from the effects of oxygen upon exposure to air.

52 Claims, 5 Drawing Figures

SURFACE PASSIVATION OF IV-VI SEMICONDUCTORS WITH AS₂S₃

BACKGROUND OF THE INVENTION

The present invention relates to the process for passivating and stabilizing the surface of lead chalcogenides, and to the devices prepared thereby.

As used here, it is convenient to describe the surface of a semiconductor material that has been rendered inert to ambient gases as a passivate surface. It is well known that adsorption of oxygen onto the surfaces of lead chalcogenide crystals causes the formation of a strong p-type surface layer. For those not familiar with recent advances in this art, the following brief bibliography is offered:

Surface Interaction of H and O₂ On Thin Epitaxic Films, by G. F. McLane and J. N. Zemel, Thin Solid Films, Vol. 7, pg. 229 (1971);

Photoconductivity In Lead Selenide, Experimental, by J. N. Humphrey and W. W. Scanlon, Physical Review, 105, 469 (1957);

Surface Transport Phenomena In PbSe Epitaxial Films, by M. H. Brodsky and J. N. Zemel, Physical Review, 155, 780 (1967);

The Effect Of Oxygen On Epitaxial PbTe, PbSe And PbS Films, by R. F. Egerton and C. Juhasz, Thin Solid Films, 4, 239 (1969). Although extensive work has been done with passivation of silicon aand germanium, (e.g., Oxidation Of Semiconductive Surfaces For Controlled Diffusion, U.S. Pat. No. 2,802,760, August, 1957 or Method Of Fabricating An Ensulated Gate Field-Effect Device, U.S. Pat. No. 4,010,290, March, 1977) little is known about passivation of the lead chalcogenides.

SUMMARY OF THE INVENTION

A process for preparing and, a lead chalcogenide device having a stabilized surface conductivity upon exposure to ambient gases. The surface layer of a semiconductor, created by exposure of the semiconductor to a source of gas (e.g., oxygen, hydrogen) such as air or moisture, is removed by vacuum annealing, and the semiconductor coated with arsenic-trisulfide, As₂S₃. Alternately, as-grown semiconductors may be cooled and coated with arsenic-trisulfide prior to exposure to air.

Accordingly, it is an object of the present invention to provide a process for stabilizing the electrical properties of lead chalcogenide semiconductors.

It is another object to provide a process for stabilizing the surface conductivity of lead chalcogenide semiconductor devices.

It is another object to provide a process for stabilizing the surface conductivity of lead chalcogenide semiconductor devices.

It is still another object to provide a lead chalcogenide device having a stabilized surface conductivity upon exposure to ambient gases such as ionic oxygen or hydrogen.

It is yet another object to provide a stable, protective coating for lead chalcogenide semiconductor devices.

It is still yet an object to provide a stable coating for insulating lead chalcogenide semiconductor devices from the effects of ambient gases.

BRIEF DESCRIPTION OF THE DRAWINGS

A more complete appreciation of this invention, and many of the attendant advantages thereof, will be readily appreciated as the same becomes better understood by reference to the details of the following description when considered in conjunction with the accompanying drawings in which like numbers indicate the same or similar components, wherein.

DETAILED DESCRIPTION

Figure 1:
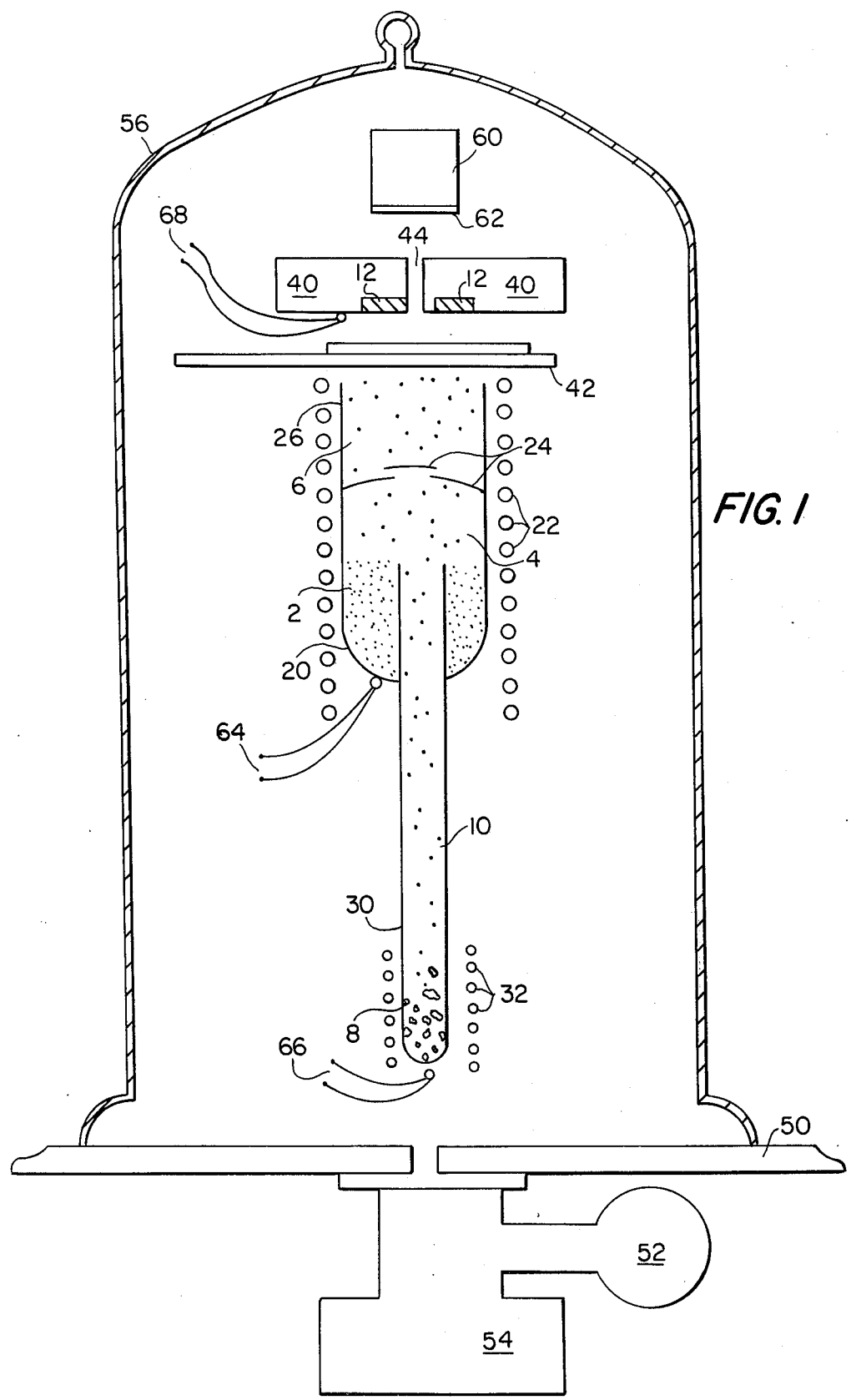
FIG. 1 is a cross-sectional view of conventional vacuum deposition furnance.

Epitaxial films of $PbS_xSe_{1-x}$ ($x = 0, 0.50, 0.80, 0.85, 1$) and $Pb_{1-y}Sn_ySe$ ($y = 0.07$) were deposited on freshly cleaved (111) $BaF_2$ using the apparatus shown in FIG. 1. The apparatus is a conventional glass belljar 56 system of the type disclosed in the copending patent application, Equilibrium Growth Technique For Preparing $PbS_xSe_{1-x}$ Epilayers, filed on 27 May, 1977 and assigned Ser. No. 801,431, with a nitrogen cold trap (not shown) and an oil diffusion pump 54. Deposition pressures and substrate temperatures were on the order of $10^{-6}$ Torr ($\sim 1.3 \cdot 10^{-4}$ Pa) at gauge 52 and 350° to 400° C., respectively. The main furnace 20 was maintained at 600° C. Growth rates were in the range of two to four microns per hour. The source 2 to substrate 12 distance was four centimeters, and the main furnace 20 was two centimeters in diameter. Approximately twenty grams of granulated source material 2 was placed in the upper quartz furnance 20. This was sufficient material to obtain fifteen to twenty epilayers 14 of constant composition. A coaxial, auxiliary furnance 30, maintained at nearly room temperature, was used to coevaporate a small amount of sulfur during growth of the $PbS_xSe_{1-x}$ epilayers ($0.5 \leq x \leq 1$). This source was needed to obtain nearly stoichiometric p-type films. In the $Pb_{1-y}Sn_ySe$ films ($0 \leq y \leq 0.07$) stoichiometry was controlled by the ingot composition from which source charge 2 was obtained, and from which the films were grown. A 0.5% metal-rich ingot yielded n-type films while a nearly stiochiometric ingot produced p-type films of low minority charge carrier density. A more complete description of the details of preparing lead chalcogenide epilayers is given in the earlier mentioned patent application, Ser. No. 801,431.

After cooling, the films were exposed to the atmosphere and inserted into a second vacuum system in which gold electrical contacts were evaporated for the transport measurements. Conventional direct current electrical measurements were made at room temperature and 77° K. using silver paint over gold pads to make electrical contacts. The samples were measured in air at 300° K. and immersed in liquid nitrogen for the 77° K. measurement. Typical sample currents were of the order of 0.5 to 1 mA. The magnetic field was in the range of 1 to 3kG. The Hall mobility and carrier concentration were calculated from $\mu_H = \sigma R_H$ and $R_H = -1/nq$.

Figure 2:
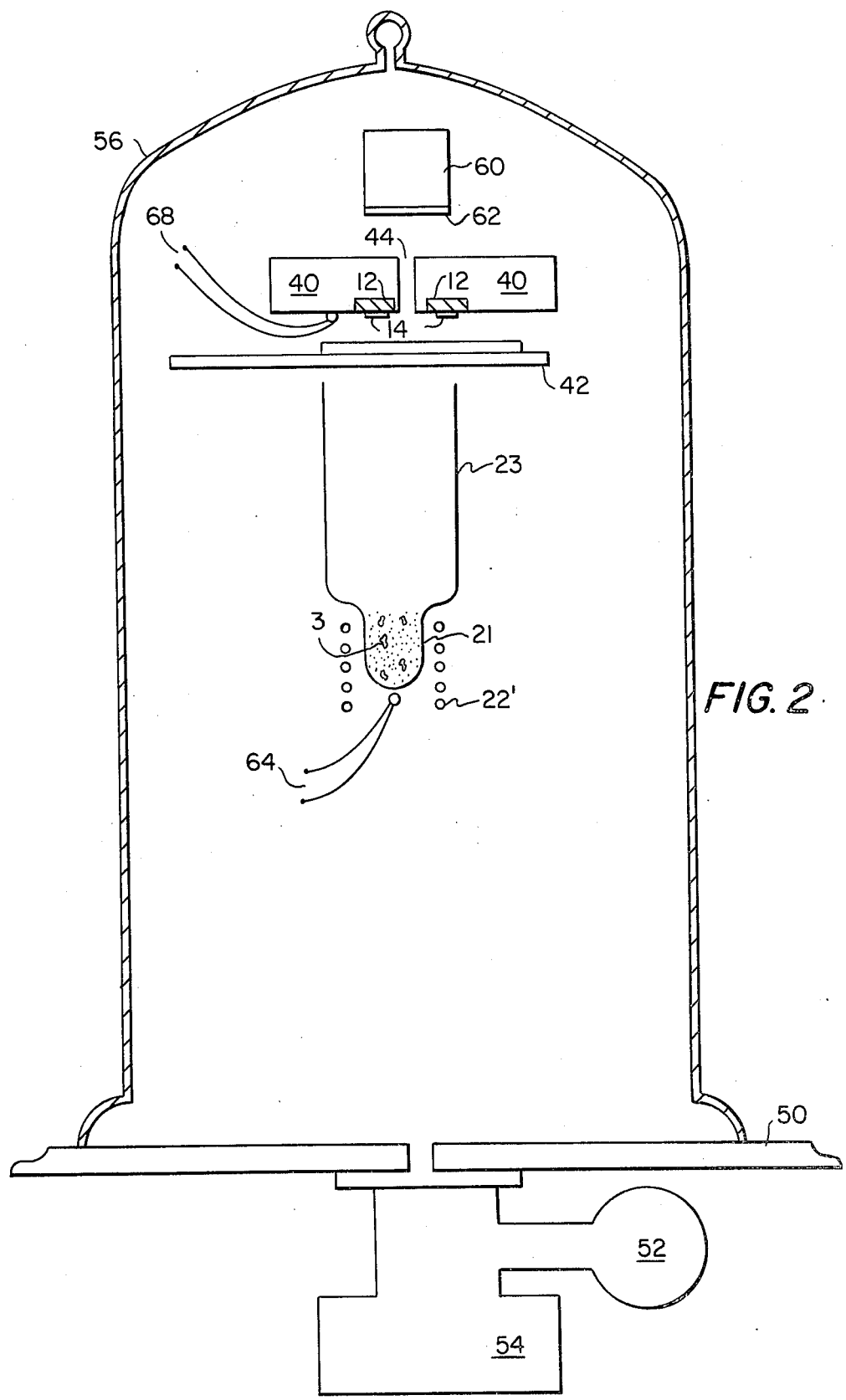
FIG. 2 is a cross-sectional view of a vacuum deposition furnace in which the process of this invention may be practiced.

Coating a lead chalcogenide film with $As_2S_3$ stabilizes the film's electrical properties. Samples of several epilayers of lead chalcogenide alloys were annealed in a vacuum chamber of the type shown in FIG. 2 (i.e., a second stage of a multi-stage vacuum deposition apparatus having the furnace shown in FIG. 1 as a first stage), cooled to about room temperature, and coated with about 3000 Å of $As_2S_3$. Annealing was performed by heating the sample epilayers to 150° Celsius for thirty minutes at a gauge pressure 52 of $1 \cdot 10^{-6}$ Torr ($\sim 1.3 \cdot 10^{-4}$ Pa) in order to remove ambient gases such as oxygen and hydrogen from the surface of the epilayers. After annealing, the epilayer is cooled to a temperature between 4° Kelvin and 100° C. Prior to coating, a portion of the 99.999% $As_2S_3$ charge (i.e., a fine powder) was heated to remove moisture and oxides. The $As_2S_3$ charge 3 was evaporated onto the cooled epilayer from a quartz ampoule 21 with a nichrome heater winding 22'. A rate monitor 60 with a quartz crystal face 62 was used to measure the amount of $As_2S_3$ deposited. The deposition rate was approximately 1000 Å per minute. The resistance of each sample was recorded during the vacuum anneal, during the coating procedure, and after exposure to air.

The electrical properties of six of the sample films, measured before and after coating, are shown in Table 1.

| Sample | Thickness ($\mu$m) | As-grown $\frac{1}{R_H e}$ (cm$^{-3}$) | As-grown $\mu H(\frac{cm^2}{V-s})$ | Overcoated $\frac{1}{R_H e}$ (cm$^{-3}$) | Overcoated $\mu H(\frac{cm^2}{V-s})$ |
|---|---|---|---|---|---|
| $PbS_{0.8}Se_{0.2}$ | 14 | 0.10 | $+3.1 \times 10^{18}$ | 1800 | $+5.3 \times 10^{17}$ | 1600 |
| $PbS_{0.5}Se_{0.5}$ | 12 | 0.18 | $+1.8 \times 10^{18}$ | 2100 | $+8.3 \times 10^{17}$ | 1600 |
| PbSe | 9 | 0.27 | $+1.7 \times 10^{18}$ | 4300 | $+9.3 \times 10^{17}$ | 3500 |
| PbSe | 19 | 0.50 | $+9.1 \times 10^{17}$ | 3300 | $-4.1 \times 10^{17}$ | 2400 |
| $Pb_{0.93}Sn_{0.07}Se$ | 73 | 0.29 | $+7.5 \times 10^{17}$ | 2300 | $+2.5 \times 10^{17}$ | 4500 |
| $Pb_{0.93}Sn_{0.07}Se$ | 122 | 0.68 | $+4.4 \times 10^{17}$ | 10,000 | $+3.2 \times 10^{17}$ | 11,500 |

The surface charge carrier concentration was reduced significantly in all the samples coated. This change is greatest in the thinner samples, and occurred during the annealing procedure thus indicating that the change is due to desorption of oxygen and reduction of the excess surface charge. The resistance of the films did not change either during the coating procedure or when the films were subsequently exposed to air. This indicates that the $As_2S_3$ coating does not produce over about $1 \cdot 10^{13}$ ionized surface states, but forms a stable, protective layer. No degradation was observed in any of the coated films, even after temperature cycling from room temperature to 77° Kelvin numerous times, an indication that the $As_2S_3$ layer either is flexible and obtains a good mechanical bond to lead chalcogenide, or that there is a near identity between the coefficients of thermal expansion of $As_2S_3$ and lead chalcogenide films.

A discussion of other details of these experimental procedures, and of the principles upon which they are based appears in Surface Charge Transport In $PbS_xSe_{1-x}$ And $Pb_{1-y}Sn_ySe$ Epitaxial Films, written by the inventors hereof, and published in the Journal Of Vacuum Science Technology, Volume 13, No. 4, July/August, 1976.

Figure 3:
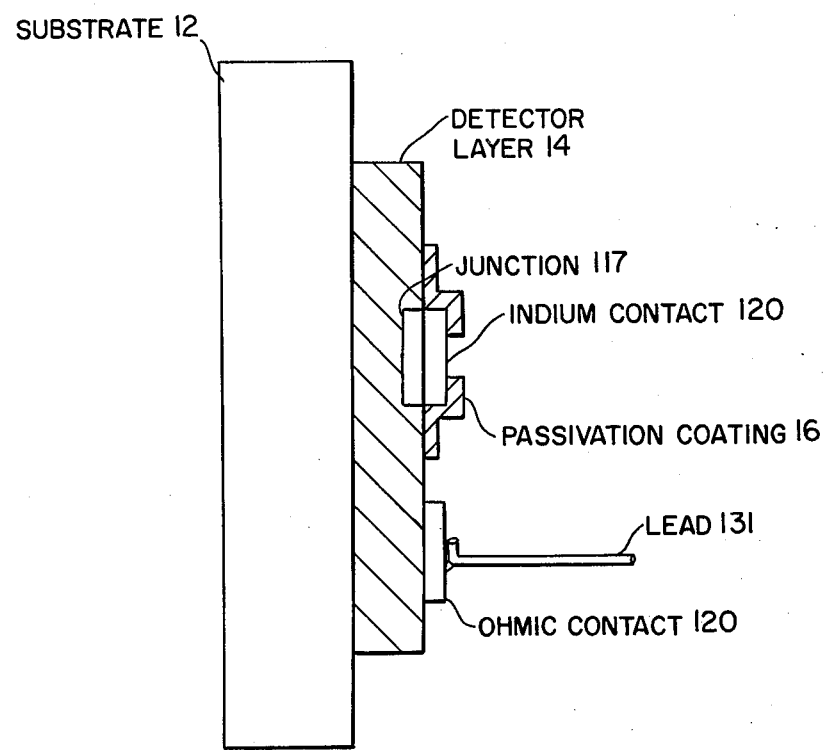
FIG. 3 is an orthogonal projection of a semiconductor device passivated according to the present invention.

Lead chalcogenide epilayers passivated according to the present invention may be further processed to prepare any of the typical semiconductor devices such as the photovoltaic cell shown in FIG. 3. By photolithographic techniques well known to those skilled in the arts, windows may be etched through the arsenic trisulfide insulating layer 16. Regions of epilayer 14 underlying the exposed areas may be converted to regions of opposite type conductivity either by vacuum diffusion or ion implantation techniques. Ohmic and non-ohmic electrical contacts may be attached to selected of the exposed areas. In the alternate, a complete semiconductor device may be prepared, annealed in a vacuum, cooled, and then coated with an insulating layer of arsenic trifulfide.

Figure 4A:
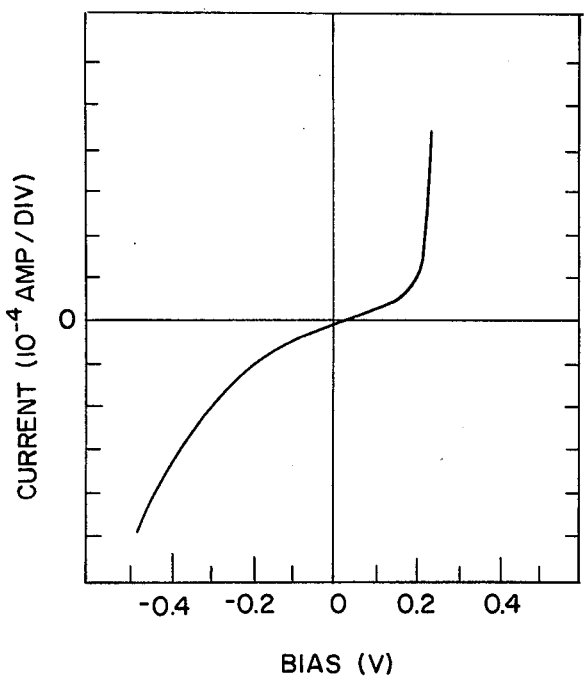
FIG. 4A is an orthogonal graph illustrating the current-voltage characteristics at 77° K. of a prior art photodiode after explosure to oxygen.
Figure 4B:
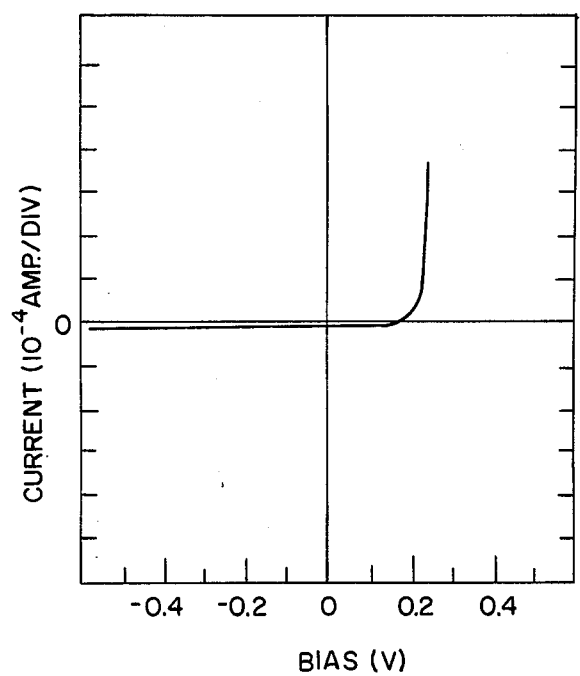
FIG. 4B is an orthogonal graph illustrating the current-voltage characteristics at 77° K. of a photodiode prepared according to the present invention, after exposure to oxygen.

FIG. 4A is a graph of the current-voltage characteristic of a typical prior art photodiode after exposure to air. FIG. 4B is a graph of the same characteristic of a photodiode passivated according to the present invention. In both of the photodiodes represented by FIGS. 4A and 4B, an indium dot was diffused into an epitaxial layer 14 of lead sulfide, to form a shallow planar junction. A comparison of the two FIGS. shows that both of the diodes exhibit normal conduction when forward biased. The prior art diode however, behaves as a very leaky diode when reverse biased, while the $As_2S_3$ passivated diode has a leakage current that is an order of magnitude less.

It is apparent from the details of the preceeding description that a coating of arsenic trisulfide insulates a lead chalcogenide film from not only oxygen, but any gas in atomic form (i.e., ionized) that would alter the electric properties of the films. Such gases include hydrogen, fluorine, chlorine, bromine, iodine, sulfur, selenium, and tellurium. While the samples presented in the description were identified as epitaxial thin films of $PbS_xSe_{1-x}$ and $Pb_{1-y}Sn_ySe$, a coating of arsenic trisulfide may be applied to passivate any lead chalcogenide device, whether monolithic or multilayer, whether monocrystalline or polycrystalline, whether a thin-film or a bulk device, or whether a binary such as PbS, PbSe, PbTe, a ternary alloy such as a lead-tin or lead-cadmium chalcogenide e.g.; PbSnS, PbSnSe, PbSnTe, PbCdS, PbCdSe, PbCdTe, PbSSe or PbSeTe, or a quarternary alloy such as PbSnSSe, PbSnSTe, PbCdSSe, PbCdSTe or PbCdSeTe. A coating of arsenic trisulfide does not produce over $1 \cdot 10^{13}$ ionized surface states but forms a stable, flexible, insulating layer without thermal expansion mismatch over a temperature range extending from four degrees Kelvin. Additionally, the arsenic trisulfide layer improves the junction characteristics of a lead chalcogenide device by removing the leakage current. It should be noted that as arsenic trisulfide is transparent over a region extending from the visible to the far infrared spectrum, it has particular application to photoconductive and photovoltaic devices. Accordingly, it is apparent that the thickness of the insulating coating, earlier described as 3000 Å, is not crucial, and may be tailored to also serve as a quarter wave anti-reflective coating.

What is claimed, and desired to be secured by a Letters Patent of the United States, is:

1. A process for preparing a semiconductor device of a lead chalcogenide, comprising:
   evaporating in a vacuum a film of a lead chalcogenide on a substrate; and,
   then coating in the vacuum the element so produced with arsenic trisulfide.

2. The process set forth in claim 1 wherein the element is maintained at a temperature less than 100° C. during coating.

3. The process set forth in claim 1 wherein the element so produced has not more than $1 \cdot 10^{13}$ ionized surface states.

4. The process set forth in claim 2 wherein the element so produced has not more than $1 \cdot 10^{13}$ ionized surface states.

5. A process for preparing an element from a lead chalcogenide, comprising:
   evaporating in a vacuum a film of a lead chalcogenide as a substrate;
   cooling in the vacuum the element so produced; and,
   then coating in the vacuum the element with arsenic trisulfide.

6. The process set forth in claim 5 wherein the element is cooled to a temperature less than 100° C.

7. The process set forth in claim 5 wherein the element is maintained at a temperature less than 100° C. during coating.

8. The process set forth in claim 6 wherein the element is maintained at a temperature less than 100° C. during coating.

9. A process for passivating an element prepared from a lead chalcogenide, comprising:
   annealing the element in a closed container from which all air has been removed; and,
   then coating the element in the vacuum with arsenic trisulfide.

10. The process set forth in claim 9 wherein the element is maintained at a temperature less than 100° C. during coating.

11. A process for passivating an element prepared from a lead chalcogenide, comprising:
    annealing the element in a closed container from which all air has been removed; and,
    then coating the element with arsenic trisulfide before exposing the element to air.

12. The process set forth in claim 11 wherein the element is maintained at a temperature less than 100° C. during coating.

13. A process for passivating an element prepared from a lead chalcogenide, comprising:
    annealing the element in a closed container from which all air has been removed;
    cooling the element in the vacuum; and,
    then coating the element in the vacuum with arsenic trisulfide.

14. The process set forth in claim 13 wherein the element is maintained at a temperature less than 100° C. during coating.

15. The process set forth in claim 13 wherein the element is maintained at a temperature between four degrees Kelvin and one hundred degrees Celsius during coating.

16. The product of the process set forth in claim 15.

17. A semiconductor device, comprising:
    a lead chalcogenide member having a first type conductivity;
    the member having at least one major surface;
    a region of second and opposite type conductivity disposed into the member;
    the region having an end surface coplanar with one major surface; and
    a layer of arsenic trisulfide disposed on the major surface about the end surface.

18. A lead chalcogenide semiconductor device with a passivating coating comprising arsenic trisulfide in direct, intimate contact with the surface of the device, the coating being formed by a low temperature vacuum evaporation process.

19. A lead chalcogenide semiconductor device with a passivating coating comprising arsenic trisulfide in direct, intimate contact with the surface of the device, the coating being formed by a low temperature vacuum evaporation process and having a thickness of approximately one-quarter wavelength of the electromagnetic energy to which the device is responsive.

20. A semiconductor element, comprising:
    a body of semiconductor material having at least two regions of opposite type conductivity with a P-N junction disposed between, and formed by the abutting surfaces of, each pair of regions of opposite type conductivity;
    an end portion of at least one P-N junction exposed at a surface of the body; and,
    a coating of arsenic trisulfide disposed on the exposed end portion of the at least one P-N junction.

21. The element set forth in claim 20 further comprised of the coating encapsulating the body.

22. The element set forth in claim 20 wherein the material consists of a lead chalcogenide.

23. The element set forth in claim 22 further composed of the coating encapsulating the body.

24. The element set forth in claim 23 wherein the material is selected from the group consisting of:
    $PbS$;
    $PbSe$,
    $PbTe$;
    $PbSnS$;
    $PbSnSe$;
    $PbSnTe$;
    $PbCdS$;
    $PbCdSe$;
    $PbCdTe$;
    $PbSSe$;
    $PbSeTe$;
    $PbSnSSe$;
    $PbSnSTe$;
    $PbCdSSe$;
    $PbCdSTe$;
    $PbCdSeTe$; and,
    mixtures thereof.

25. The process set forth in claim 1 wherein the lead chalcogenide is selected from the group consisting of:
    $PbS$;
    $PbSe$;
    $PbTe$;
    $PbSnS$;
    $PbSnSe$;
    $PbSnTe$;
    $PbCdS$;
    $PbCdSe$;
    $PbCdTe$;
    $PbSSe$;
    $PbSeTe$;
    $PbSnSSe$;
    $PbSnSTe$;

PbCdSSe;
PbCdSTe;
PbCdSeTe; and,
mixtures thereof.

26. The process set forth in claim 1, further comprising:
removing moisture and oxides from the arsenic trisulfide prior to coating the element.

27. The process set forth in claim 1, further comprising:
cooling the film to room temperature prior to coating the element.

28. The process set forth in claim 1, further comprising:
exposing the film to atmosphere; and
prior to coating the element, annealing the film in a vacuum.

29. The process set forth in claim 1 wherein the film is an epitaxial layer.

30. The process set forth in claim 5 wherein the lead chalcogenide is selected from the group consisting of:
PbS;
PbSe;
PbTe;
PbSnS;
PbSnSe;
PbSnTe;
PbCdS;
PbCdSe;
PbCdTe;
PbSSe;
PbSeTe;
PbSnSSe;
PbSnSTe;
PbCdSSe;
PbCdSTe;
PbCdSeTe; and,
mixtures thereof;

31. The process set forth in claim 5, further comprising:
removing moisture and oxides from the arsenic trisulfide prior to coating the element.

32. The process set forth in claim 5, further comprising:
cooling the film to room temperature prior to coating the element.

33. The process set forth in claim 5, further comprising:
after evaporating, exposing the film to atmosphere; and
prior to cooling and coating the element, annealing the film in a vacuum.

34. The process set forth in claim 5 wherein the film is an epitaxial layer.

35. The process set forth in claim 9 wherein the lead chalcogenide is selected from the group consisting of:
PbS;
PbSe;
PbTe;
PbSnS;
PbSnSe;
PbSnTe;
PbCdS;
PbCdSe;
PbCdTe;
PbSSe;
PbSeTe;
PbSnSSe;
PbSnSTe;
PbCdSSe;
PbCdSTe;
PbCdSeTe; and,
mixtures thereof.

36. The process set forth in claim 9, further comprising:
removing moisture and oxides from the arsenic trisulfide prior to coating the element.

37. The process set forth in claim 9 further comprising:
after annealing but prior to coating the element, cooling the film to room temperature.

38. The process set forth in claim 9 wherein the element is an epitaxial layer.

39. The process set forth in claim 11 wherein the lead chalcogenide is selected from the group consisting of:
PbS;
PbSe;
PbTe;
PbSnS;
PbSnSe;
PbSnTe;
PbCdS;
PbCdSe;
PbCdTe;
PbSSe;
PbSeTe;
PbSnSSe;
PbSnSTe;
PbCdSSe;
PbCdSTe;
PbCdSeTe; and,
mixtures thereof.

40. The process set forth in claim 11, further comprising:
removing moisture and oxides from the arsenic trisulfide prior to coating the element.

41. The process set forth in claim 11, further comprising:
cooling the film to room temperature after annealing but prior to coating the element.

42. The process set forth in claim 11 wherein the element is an epitaxial layer.

43. The process set forth in claim 13 wherein the lead chalcogenide is selected from the group consisting of:
PbS;
PbSe;
PbTe;
PbSnS;
PbSnSe;
PbSnTe;
PbCdS;
PbCdSe;
PbCdTe;
PbSSe;
PbSeTe;
PbSnSSe;
PbSnSTe;
PbCdSSe;
PbCdSTe;
PbCdSeTe; and,
mixtures thereof.

44. The process set forth in claim 13, further comprising:
removing moisture and oxides from the arsenic trisulfide prior to coating the element.

45. The process set forth in claim 13, further comprising:
after annealing but before coating the element, cooling the element to room temperature.

46. The process set forth in claim 13 wherein the element is an epitaxial layer.

47. The device set forth in claim 18 wherein the lead chalcogenide is selected from the group consisting of:
PbS;
PbSe;
PbTe;
PbSnS;
PbSnSe;
PbSnTe;
PbCdS;
PbCdSe;
PbCdTe;
PbSSe;
PbSeTe;
PbSnSSe;
PbSnSTe;
PbCdSSe;
PbCdSTe;
PbCdSeTe; and,
mixtures thereof.

48. The device set forth in claim 19 wherein the lead chalcogenide is selected from the group consisting of:
PbS;
PbSe;
PbTe;
PbSnS;
PbSnSe;
PbSnTe;
PbCdS;
PbCdSe;
PbCdTe;
PbSSe;
PbSeTe;
PbSnSSe;
PbSnSTe;
PbCdSSe;
PbCdSTe;
PbCdSeTe; and,
mixtures thereof.

49. A semiconductor device, comprising:
a lead chalcogenide member having a volume of first type conductivity;
the member having at least one major surface;
a region of second and opposite type conductibity disposed into the volume;
a P-N junction formed by contiguous surfaces of the region and the volume;
the junction extending to one major surface; and
a layer of arsenic trisulfide disposed on the major surface and covering the junction.

50. A semiconductor device, comprising:
a lead chalcogenide member having a volume of first type conductivity;
the member having at least one major surface;
a region of second and opposite type conductivity disposed into the volume;
the region having an end surface coplanar with one major surface;
an electrical contact affixed to the end surface; and
a coating of arsenic trisulfide disposed on the one major surface, on the electrical contact, and about the end surface.

51. The device set forth in claim 50 wherein the electrical contact is in ohmic contact with the region.

52. The device set forth in claim 50 wherein the electrical contact is in non-ohmic contact with the region.

* * * * *